(12) United States Patent
Shih

(10) Patent No.: US 6,773,467 B2
(45) Date of Patent: Aug. 10, 2004

(54) STORAGE CAPACITOR OF PLANAR DISPLAY AND PROCESS FOR FABRICATING SAME

(75) Inventor: An Shih, Changhua (TW)

(73) Assignee: Toppoly Optoelectronics Corp., Miao-Li (TW)

( * ) Notice: Subject to any disclaimer, the term of this patent is extended or adjusted under 35 U.S.C. 154(b) by 112 days.

(21) Appl. No.: 10/292,292

(22) Filed: Nov. 12, 2002

(65) Prior Publication Data

US 2003/0224570 A1 Dec. 4, 2003

(30) Foreign Application Priority Data

Jun. 3, 2002 (TW) ........................................ 91111885 A (51) Int. Cl.⁷ ........................ H01G 9/00; H01L 27/108; H01L 29/04; H01L 29/76; H01L 31/036
(52) U.S. Cl. ........................................ 29/25.03; 257/68
(58) Field of Search .................... 29/25.03; 257/68; 438/253, 396, 381

(56) References Cited

U.S. PATENT DOCUMENTS

| 5,831,692 A | 11/1998 | Lee |
| 5,982,462 A | 11/1999 | Nakano et al. |
| 6,018,377 A | 1/2000 | Kim |
| 6,285,418 B1 | 9/2001 | Ko et al. |
| 6,310,670 B1 | 10/2001 | Lee |
| 6,600,523 B2 * | 7/2003 | Pang ........................ 349/38 |

* cited by examiner

Primary Examiner—Craig A. Thompson
(74) Attorney, Agent, or Firm—Volpe and Koenig, P.C.

(57) ABSTRACT

A storage capacitor of a planar display is disclosed. The storage capacitor includes a substrate, a lower electrode, an insulator layer, and an upper electrode in space order. The lower electrode is made of a semiconductor material such as polysilicon. The upper electrode is made of metal or polysilicon. For the metallic upper electrode, the upper electrode is patterned to have a comb, fishbone or net shape in order to allow dopants penetrating therethrough to reach the lower electrode, thereby increasing the conductivity of the lower electrode. A process for fabricating such storage capacitor is also disclosed. For the case that both the upper and lower electrodes are made of polysilicon, two doping procedures of different doping intensities are performed to provide dopants for the upper and lower electrodes, respectively.

20 Claims, 13 Drawing Sheets

STORAGE CAPACITOR OF PLANAR DISPLAY AND PROCESS FOR FABRICATING SAME

FIELD OF THE INVENTION

The present invention relates to a storage capacitor of a planar display and a process for fabricating the storage capacitor, and more particularly to a storage capacitor applied to a top gate thin film transistor liquid crystal display (TFT-LCD) and a process for fabricating the same.

BACKGROUND OF THE INVENTION

Figure 1:
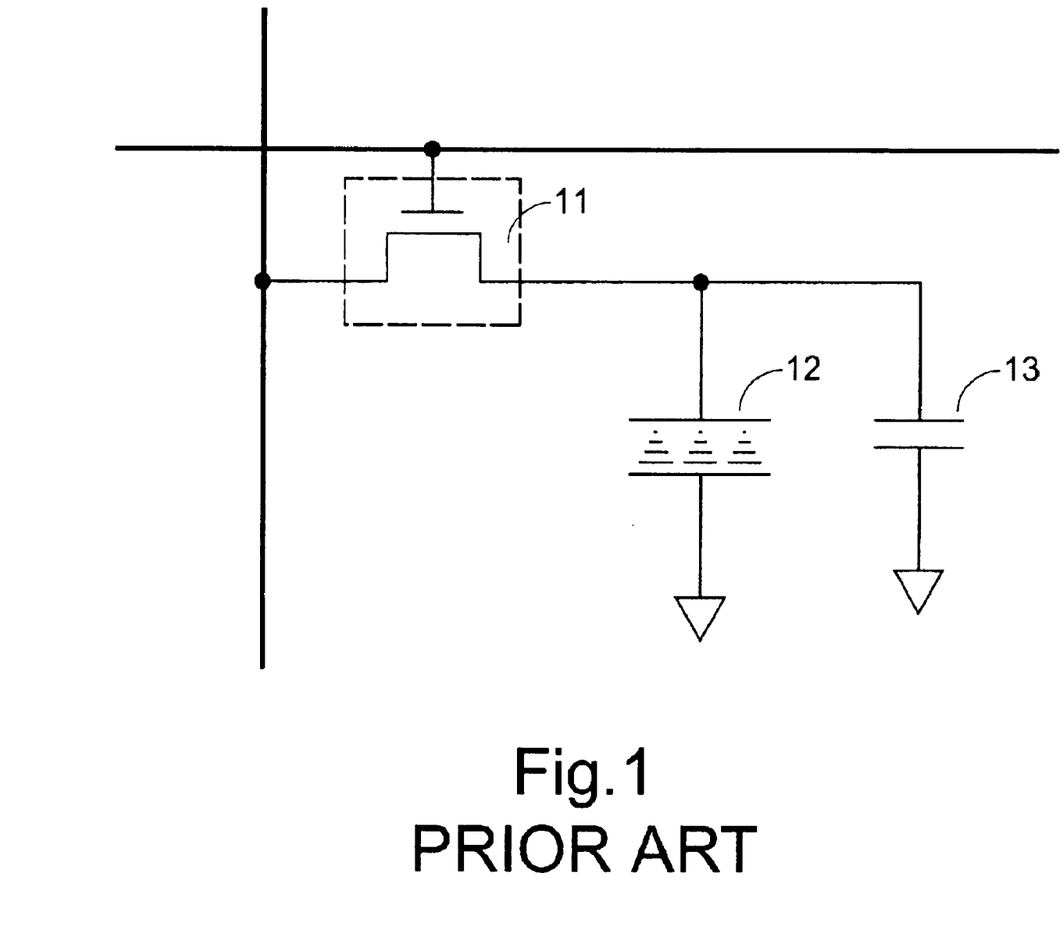
FIG. 1 is a circuit diagram showing one pixel cell of a TFT-LCD.

Nowadays, LCD has been applied to many fields of applications such as cellular phones, digital still cameras (DSCs), digital video cams (DVCs), camcorders, global positioning systems (GPSs), personal digital assistances (PDAs), personal computers (PCs), notebooks, and televisions (TVs). LCD has been playing an important role and acting as developing trend in the future with far more characteristics and advantages like thinness, low energy consumption, high resolution, high lightness, etc. Among many kinds of LCDs, TFT-LCD is so far the most popular planar display. Please refer to FIG. 1 which is a circuit diagram showing one pixel cell of a TFT-LCD. This pixel cell mainly consists of a switching unit (TFT) 11, a LCD unit 12, and a storage capacitor 13. The storage capacitor 13 is electrically connected to the LCD unit 12 in parallel to compensate the charge storage capacity of the LCD unit 12 which is also of a capacitor structure. Otherwise, the voltage of the LCD unit 12 may fall undesirably significantly due to voltage leakage after turning off the switching unit 11.

A low temperature polysilicon (LTPS) process is developed for manufacturing the TFT array of the LCD. The low temperature polysilicon has the characteristic of faster electron mobility than the amorphous silicon (a-Si) over 100 times. That explains why each pixel of low temperature polysilicon has faster response time and smaller outlined dimension comparing with amorphous silicon. FIG. 2 shows the conventional process for manufacturing a top gate LTPS-TFT on a glass substrate via a complementary metal-oxide-semiconductor (CMOS) manufacturing process. Please refer to FIG. 2(a). A buffer layer 21 (e.g. a silicon dioxide layer) and an intrinsic amorphous silicon (i-a-Si) layer are formed on the glass substrate 20. The intrinsic amorphous silicon layer is transformed into an intrinsic polysilicon (i-p-Si) layer 22 by a laser crystallization process. After the micro-photolithography and etch steps, the first intrinsic polysilicon structure 221, second intrinsic polysilicon structure 222, and third intrinsic polysilicon structure 223 are formed, as illustrated in FIG. 2(b), and later provided as parts of n-channel TFT, p-channel TFT, and storage capacitor, respectively.

Figure 2A:
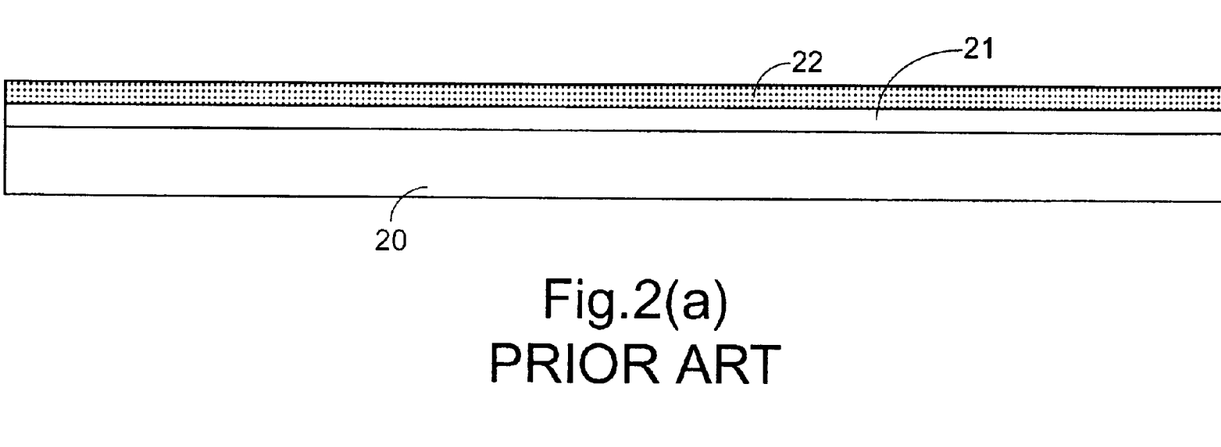
FIGS. 2(a)~(h) are schematic diagrams showing a conventional CMOS process for manufacturing a top gate LTPS-TFT on a glass substrate.
Figure 2B:
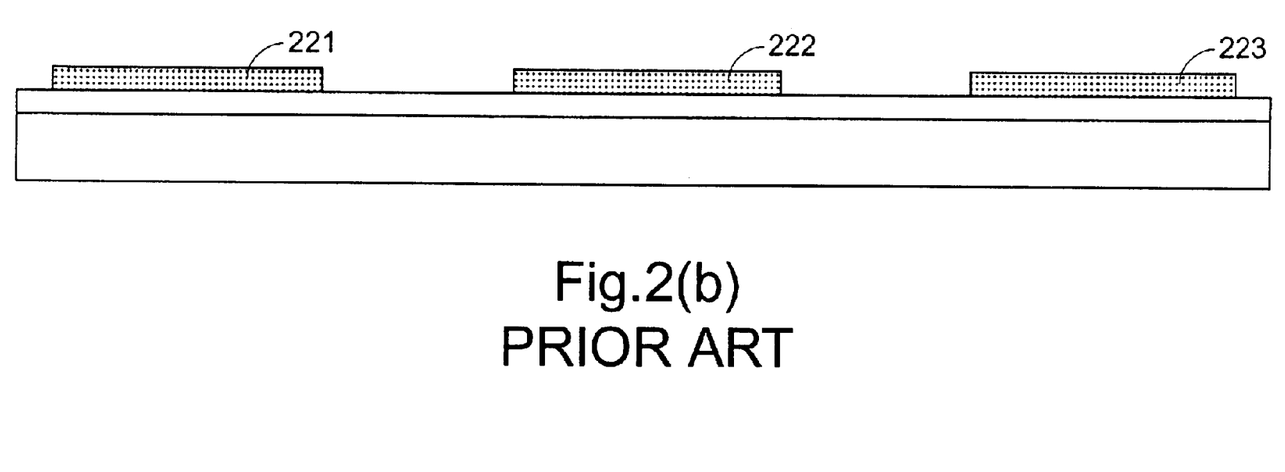
Figure 2C:
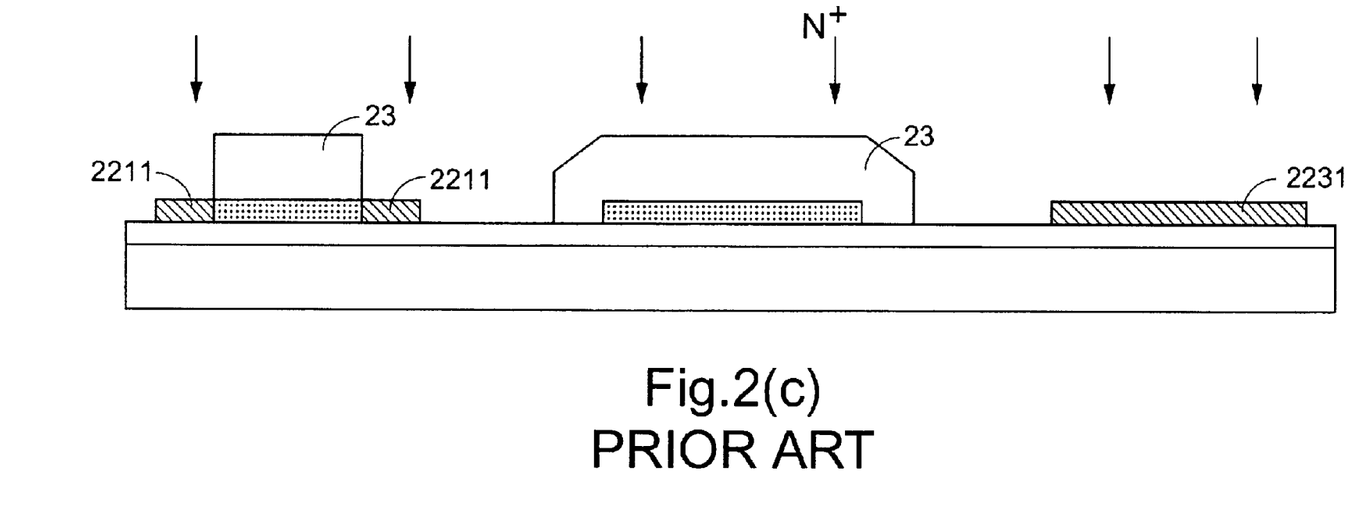
Figure 2D:
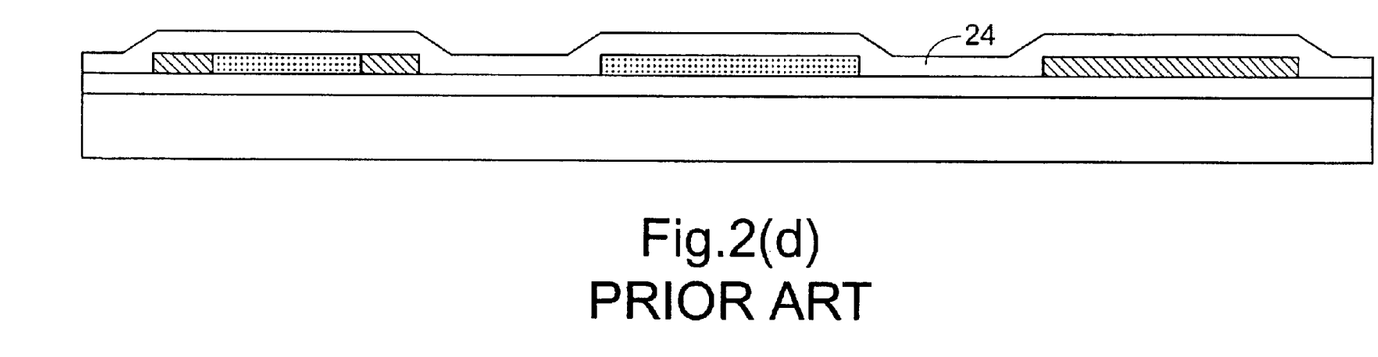

A photoresist layer is then deposited on the resulting strcuture of FIG. 2(b). Afterwards, a micro-photolithography process is performed to form masks 23 on the first polysilicon structure 221 and second polysilicon structure 222. Further referring to FIG. 2(c), an $n^+$-doping step is performed on the polysilicon layer with the mask of the photoresist 23 to define the source/drain regions 2211 of the n-channel TFT and the lower electrode 2231 of the storage capacitor. After removing the photoresist masks 23, an insulating layer (e.g. silicon dioxide layer) is applied to the resulting structure to form a gate insulator layer 24 as shown in FIG. 2(d).

Figure 2E:
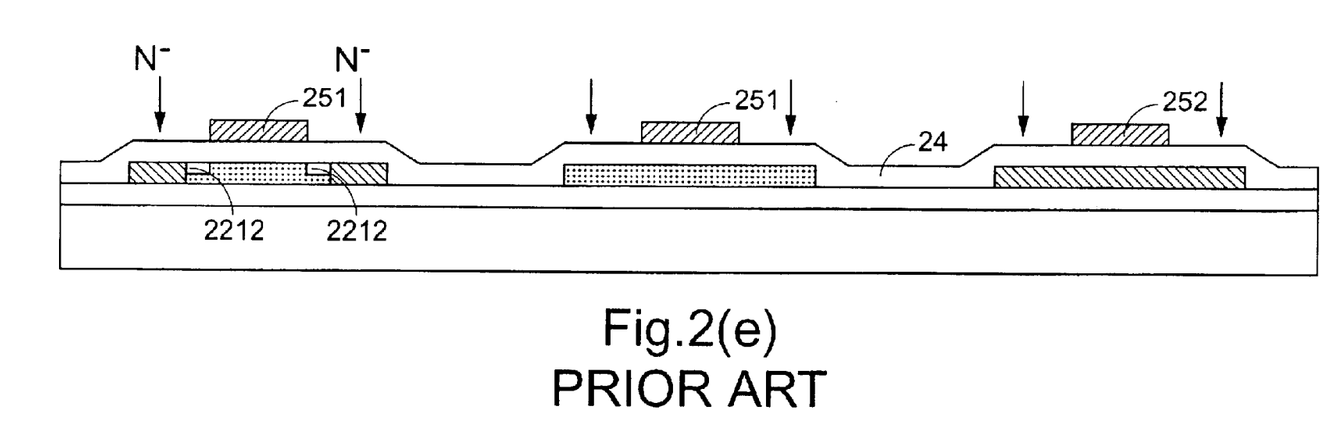
Figure 2F:
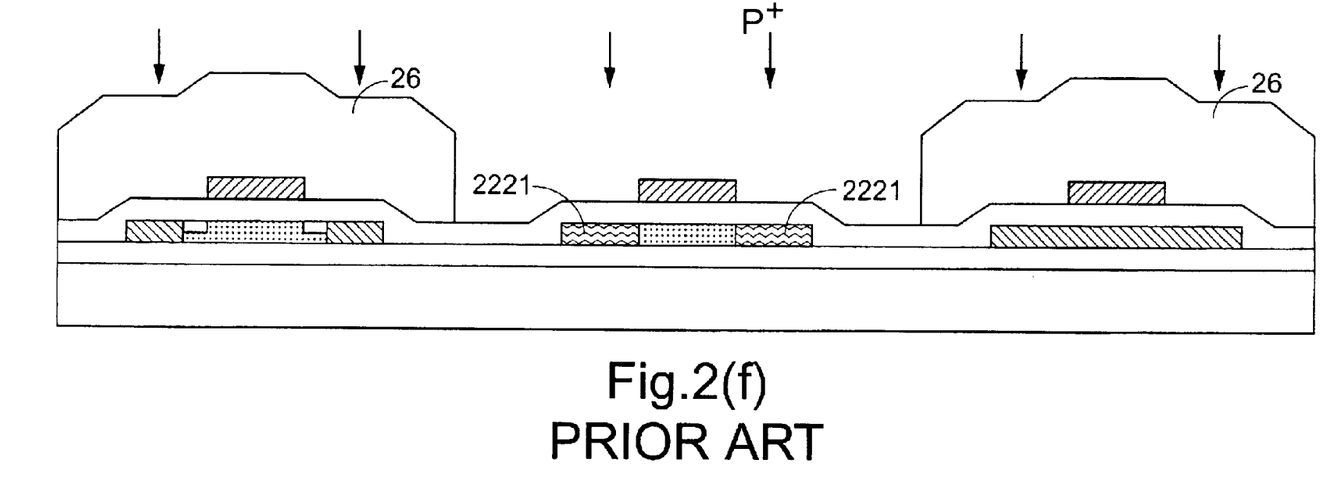

Please refer to FIG. 2(e). After sputtering a gate metal layer on the gate insulator layer 24, the gate metal layer is patterned and etched to form a gate metal structure 251 and the upper electrode 252 of the storage capacitor. Then, the gate metal structure 251 serves as a mask for a following lightly $n^-$-doping step to form a lightly doped drain structure 2212. Afterwards, another photoresist layer is applied to the resulting structure and patterned and etched to form masks 26 on the n-channel TFT region and the storage capacitor region. A $p^+$-doping step is then performed to form the source/drain electrodes 2221 of the p-channel TFT region, as shown in FIG. 2(f).

Figure 2G:
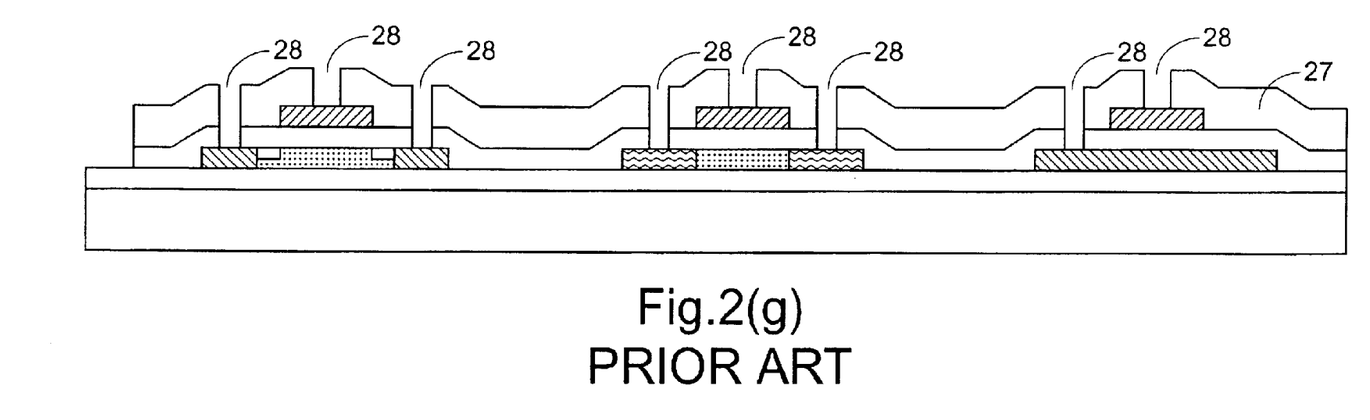

After removing the photoresist masks 26, an inter-layer dielectric layer 27 is provided, and a plurality of contact holes 28 are created by penetrating through the dielectric layer 27 at appropriate positions, as shown in FIG. 2(g). Then, a metal layer is deposited by sputtering to fill the contact holes 28, and patterned and etched to form gate contact structures 290, source/drain contact strictures 291, and electrode contact structures 292 of the storage capacitor. In the above structure, the lower electrode 2231 of the storage capacitor is made of highly doped $n^+$-polysilicon and has excellent conductivity. Therefore, the capacitance provided by the lower electrode 2231 and upper electrode 252 is enough for most situations.

For some cases where the presence of the LDD stricture is not critical, the above process will be cost-inefficient. Therefore, other processes omitting the relating steps of the LDD structure are developed to reduce the production cost. One of the examples is illustrated with reference to FIGS. 3(a) and 3(b). After the steps similar to the ones illustrated with reference to FIGS. 2(a) and 2(b) are performed, a gate insulator 24 (e.g. silicon dioxide layer) and a gate metal layer are applied to the resulting structure. A photolithography process is executed to pattern the gate metal layer and thus form the gate structures 35, 36 and upper electrode 37 on the intrinsic polysilicon structure 221, 222, and 223, respectively. The gate structures 35 and 36 have smaller size than the first and second intrinsic polysilicon structures 221 and 222, and the upper electrode 37 is smaller than the lower electrode 223. Afterwards, a photoresist layer is deposited and patterned to form a mask 38 on the second intrinsic polysilicon structure 222. Then, an $n^+$-doping procedure is performed on the portion exposed from the mask 38 to define the source/drain electrodes of the n-channel TFT. The following procedures are similar to those shown in FIGS. 2(f) to 2(h) and will not be described again herein.

Figure 3A:
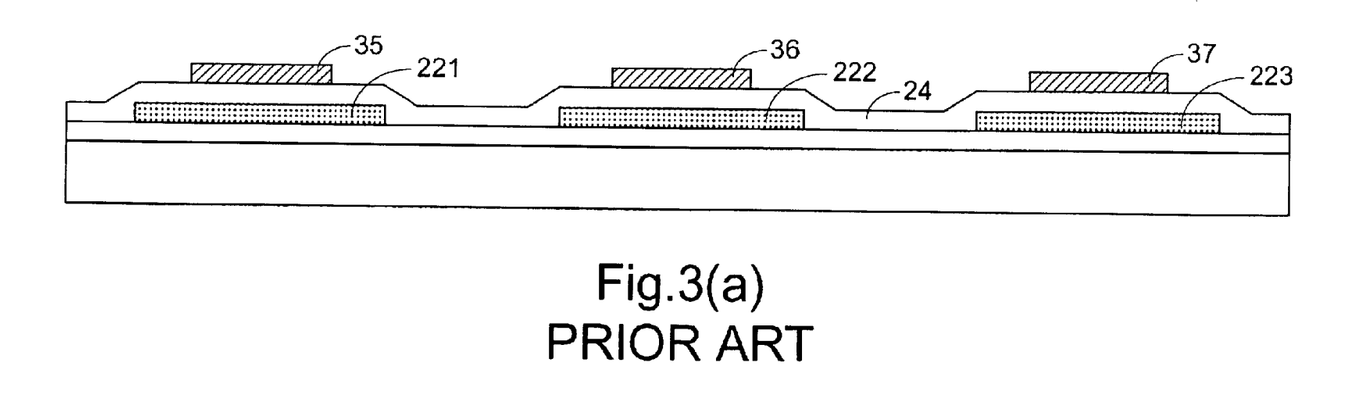
FIGS. 3(a)~(c) are schematic diagrams showing another conventional process for manufacturing a top gate LTPS-TFT without the LDD structure.
Figure 3B:
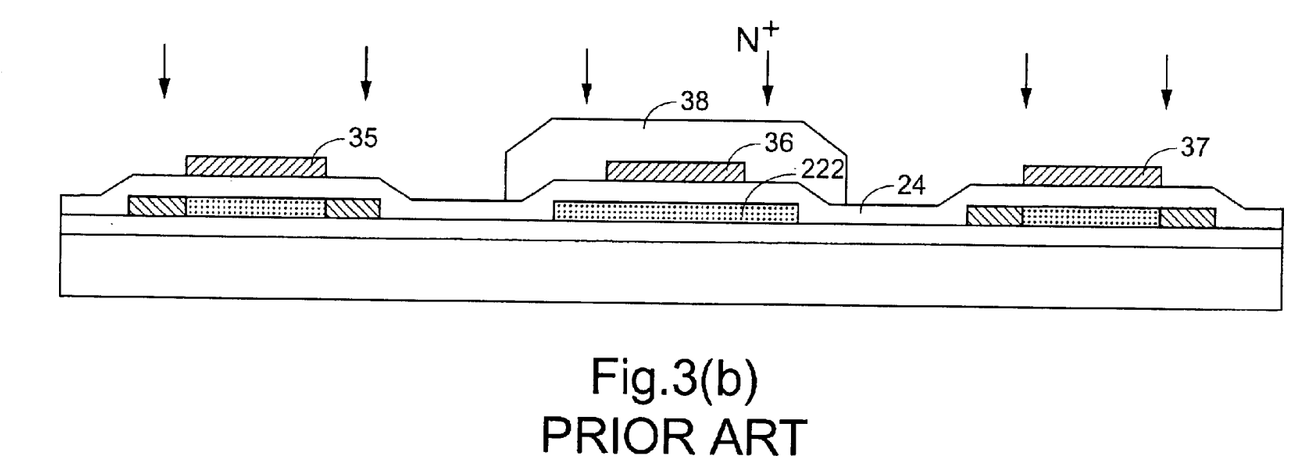
Figure 3C:
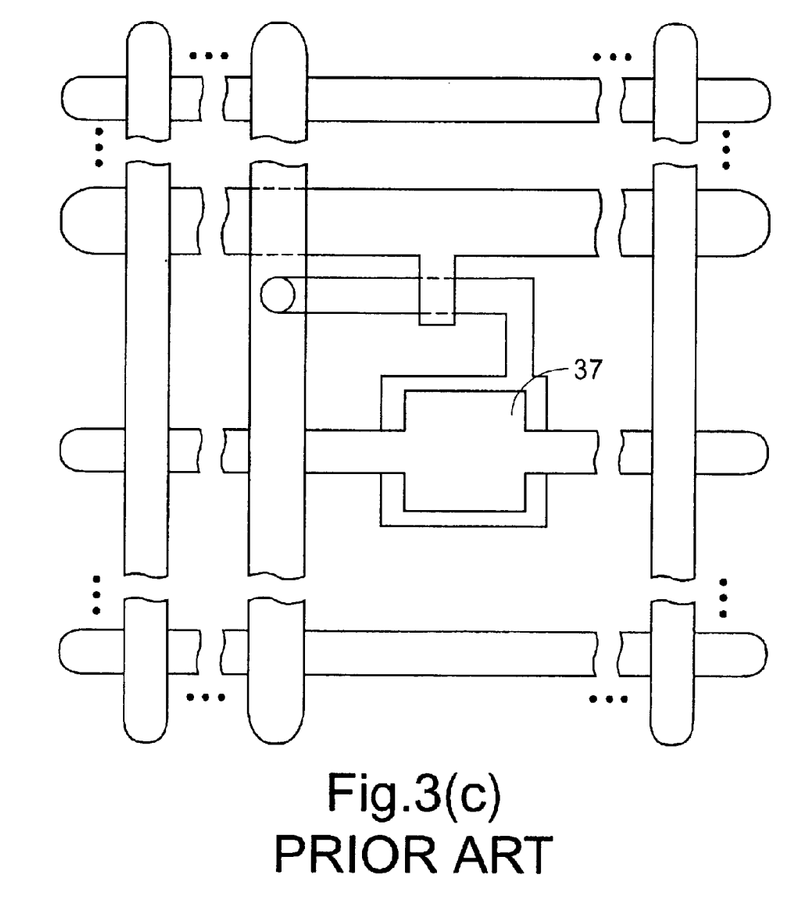

In this process, the upper electrode 37 is formed prior to the $n^+$-doping procedure. Due to the shield of the upper electrode 37, as shown in FIG. 3(b) or 3(c), the lower electrode 223 cannot be well defined by the $n^+$-doping procedure. Therefore, the conductivity of the storage capacitor is not satisfactory.

Figure 4A:
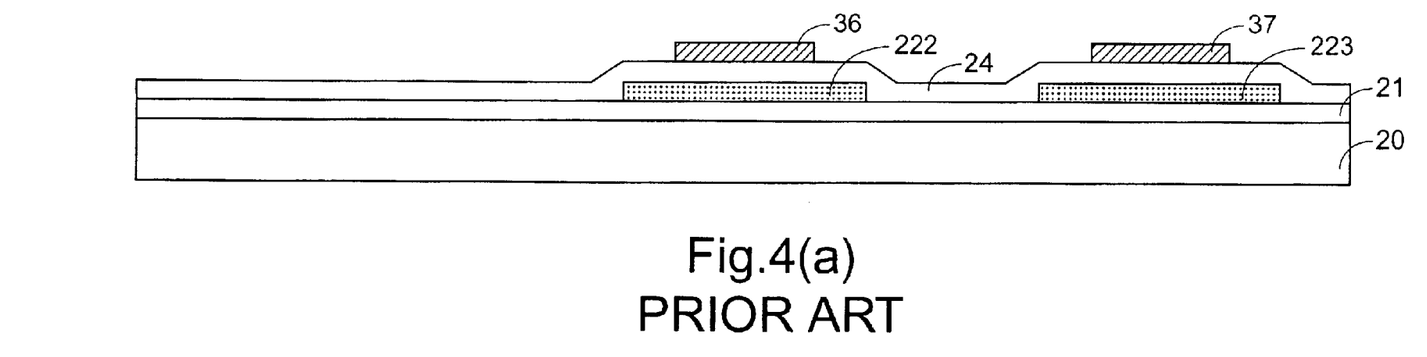
FIGS. 4(a)~(b) are schematic diagrams showing a conventional PMOS process for manufacturing a top gate LTPS-TFT.
Figure 4B:
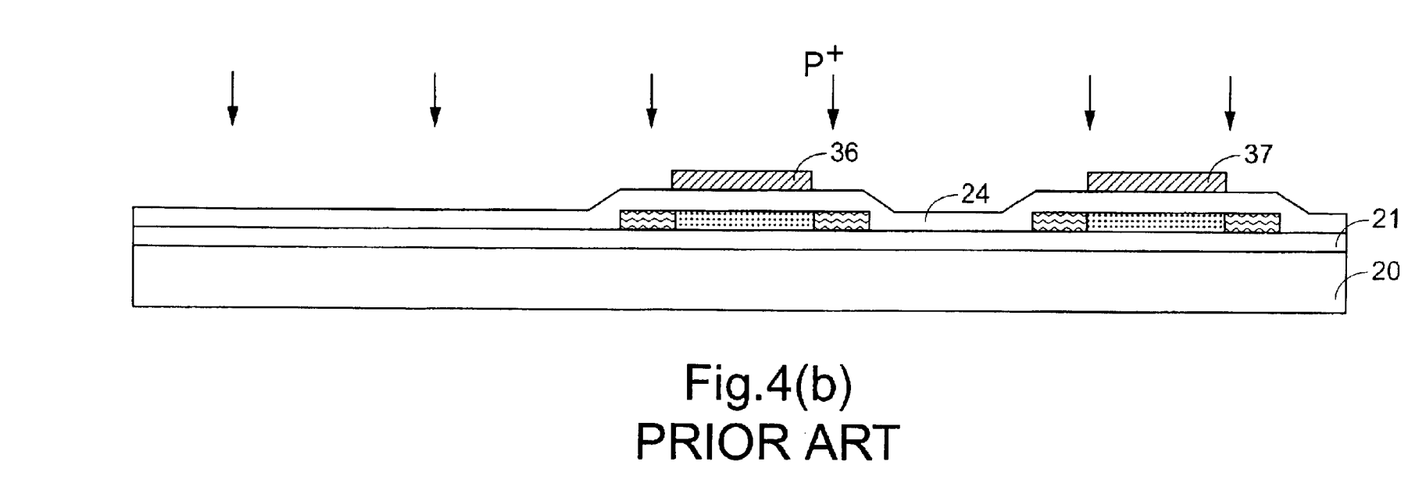

Occasionally, essentially one of the n-channel TFT or the p-channel TFT is required and thus formed in the TFT matrix. FIGS. 4(a) and 4(b) show an exmaple that only the p-channel TFT is formed. The steps and numeral references are similar to those shown in FIGS. 3(a) and 3(b) except that the steps specific to the n-channel TFT region are omitted. Along with the $p^+$-doping step for forming the source/drain electrodes of the p-channel TFT, the polysilicon structure 223 is doped to form the lower electrode of the storage capacitor. The following procedures are similar to those shown in FIGS. 2(g) and 2(h) and will not be described again herein. Due to the shield of the upper electrode 37, the lower electrode cannot be well defined by the $p^+$-doping procedure. Therefore, the conductivity of the storage capacitor is not satisfactory.

SUMMARY OF THE INVENTION

An object of the present invention is to provide a storage capacitor structure having improved capacitance.

Another object of the present invention is to provide a process for fabricating a storage capacitor having improved capacitance.

A first aspect of the present invention relates to a storage capacitor of a planar display. The storage capacitor includes structures of a substrate; a lower electrode formed on the substrate and made of a semiconductor material; an insulator layer formed on the lower electrode; and an upper electrode formed on the insulator layer and having a dopant passage therein for allowing dopants to penetrate therethrough to reach the lower electrode. The storage capacitor is especially suitable for a top gate thin film transistor liquid crystal display (TFT-LCD), preferably a low temperature polysilicon (LTPS) TFT-LCD. Generally, the lower electrode is electrically connected to the drain electrode of a top gate TFT of the LCD, and the substrate is generally a transparent substrate.

In an embodiment, the lower electrode is made of doped polysilicon, the insulator layer is made of silicon dioxide, and the upper electrode is made of metal.

Preferably, the upper electrode is in a shape selected from a group consisting of a comb, a fishbone and a net so as to provide the dopant passage therein.

A second aspect of the present invention relates to a process for fabricating a storage capacitor of a planar display. The process includes steps of providing a substrate; applying a semiconductor layer onto the substrate; defining a lower electrode region in the semiconductor layer; applying an insulator layer onto the lower electrode region; forming an upper electrode having a dopant passage therein on the insulator layer; and doping the lower electrode region through the dopant passage to form the lower electrode.

Preferably, the lower electrode region is defined by a micro-photolithography procedure perfomed on the semiconductor layer, and the upper electrode is formed with the dopant passage by a micro-photolithography procedure perfomed on a metal layer.

Preferably, the doping step is perfomed along with the source/drain formation of a TFT of the planar display.

A third aspect of the present invention relates to a process for fabricating a storage capacitor of a planar display comprising steps of: providing a substrate; applying a first semiconductor layer onto the substrate; defining a lower electrode in the first semiconductor layer; applying an insulator layer onto the lower electrode region; applying a second semiconductor layer onto the insulator layer; defining an upper electrode in the second semiconductor layer; performing a first doping operation with a first doping intensity to provide dopants in the lower electrode; and performing a second doping operation with a second doping intensity less than the first doping intensity to provide dopants in the upper electrode.

Preferably, the first and second semiconductor layers are both made of polysilicon.

The first doping operation can be performed before or after the second doping operation. Preferably, the first and the second doping operations are performed successively.

A fourth aspect of the present invention relates to a storage capacitor of a planar display, comprising: a substrate; a lower electrode formed on the substrate and made of a first doped extrinsic semiconductor material; an insulator layer formed on the lower electrode; and an upper electrode formed on the insulator layer and made of a second doped extrinsic semiconductor material.

Preferably, the first and second doped extrinsic semiconductor materials are both polysilicon.

Preferably, the lower electrode is electrically connected to the drain electrode of a top gate TFT of the LCD.

BRIEF DESCRIPTION OF THE DRAWINGS

The present invention may best be understood through the following description with reference to the accompanying drawings, in which.

DETAILED DESCRIPTION OF THE INVENTION

FIG. 5 shows the process for manufacturing a top gate LTPS-TFT without the LDD structure on a glass substrate via a CMOS process according to the present invention. Please refer to FIG. 5(a). A buffer layer 21, with a thickness of 600 nm, is formed on the glass substrate 20 by a plasma enhanced chemical vapor deposition (PECVD) process. The buffer layer 21 can be a silicon dioxide layer, a silicon nitride layer, or the combination thereof. Then, an intrinsic amorphous silicon layer, with a thickness of 50 nm, is formed over the buffer layer 21 by a PECVD process. After being dehydrogenated under 400° C. for 30 minutes, the intrinsic amorphous silicon layer is transformed into an intrinsic polysilicon layer 22 by executing a laser anneal process. The laser energy is 400 mJ/cm$^2$ at 100 shots. After the micro-photolithography and etch steps, the first intrinsic polysilicon structure 221, second intrinsic polysilicon structure 222, and third intrinsic polysilicon structure 223 are formed, as illustrated in FIG. 5(b), and later provided as parts of n-channel TFT, p-channel TFT, and storage capacitor respectively.

Figure 5A:
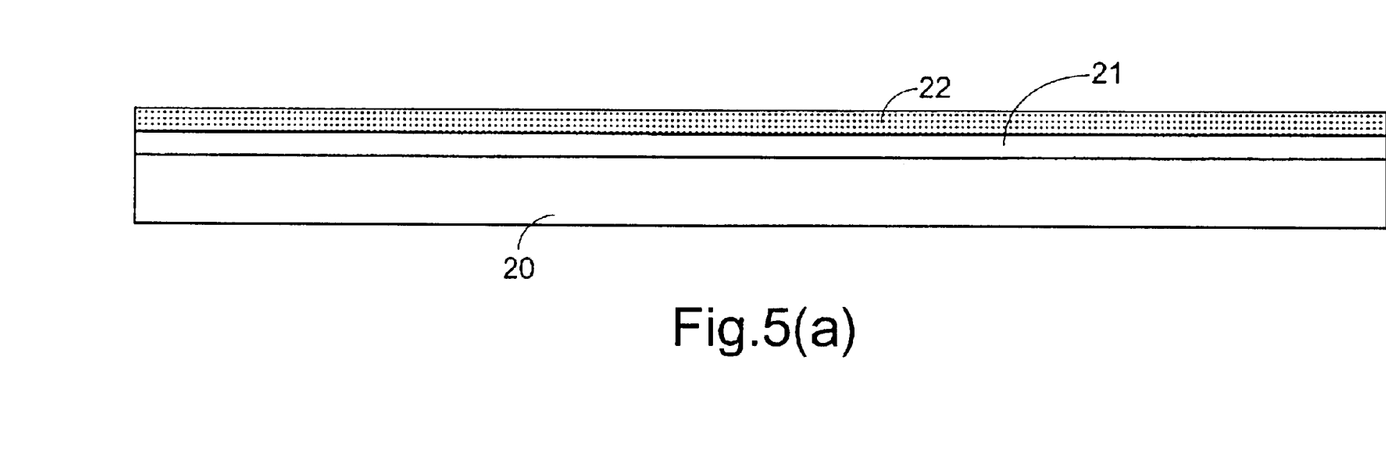
FIGS. 5(a)~(e) are schematic diagrams showing a CMOS process for manufacturing a top gate LTPS-TFT according to a preferred embodiment of the present invention.
Figure 5B:
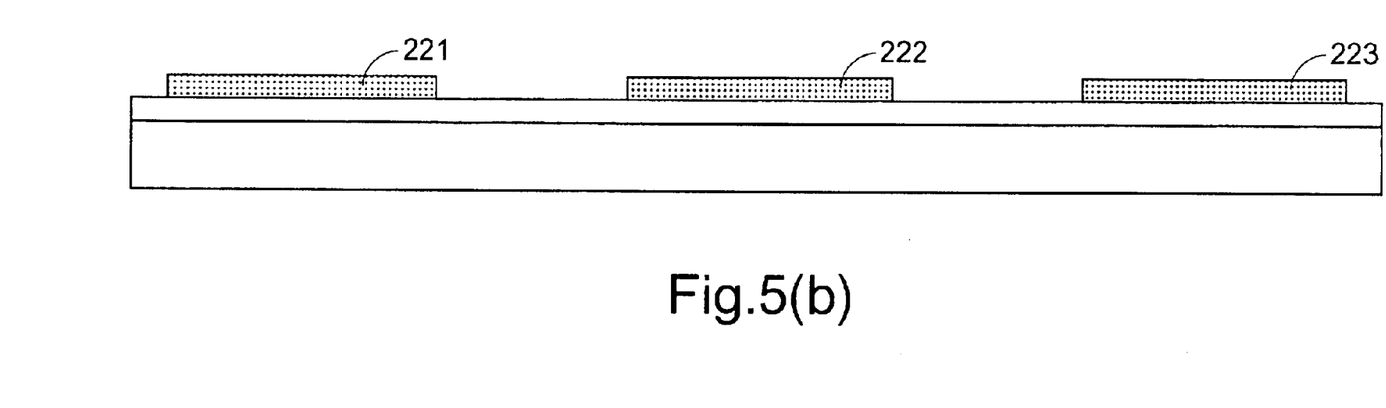
Figure 5C:
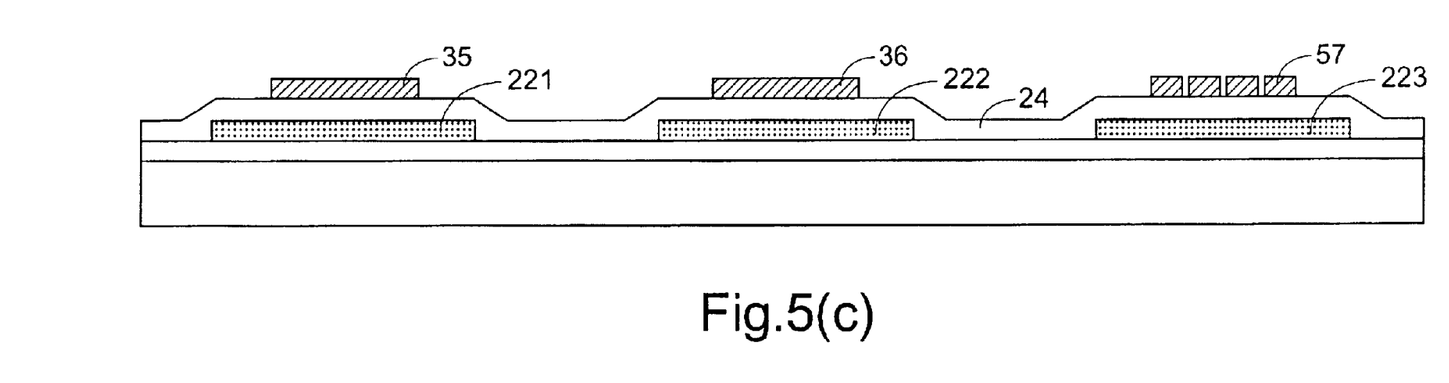
Figure 5D:
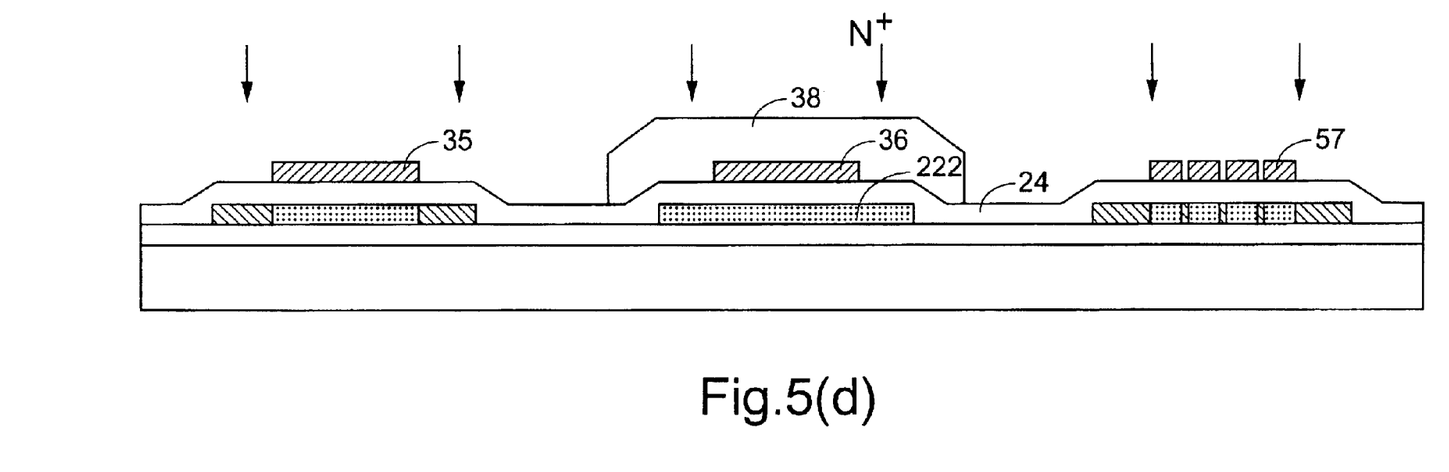
Figure 5E:
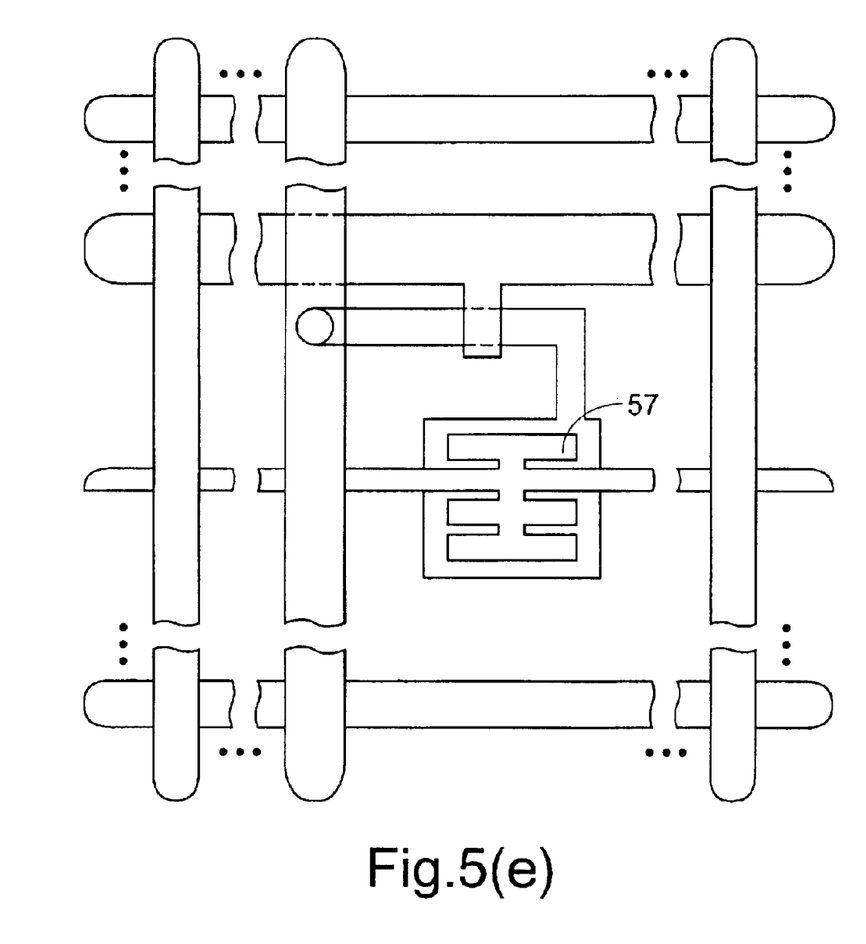

Please refer to FIG. 5(c). The structure of FIG. 5(b) is covered with a gate insulator 24 (e.g. 100 nm silicon dioxide layer) by a PECVD process. Then, a gate metal layer is sputtered on the gate insulator 24 with a thickness of 200 nm. The material of the gate metal layer can be selected from chromium, tungsten, tantalum, aluminum or copper. A micro-photolithography process is executed to pattern the gate metal layer and thus to form the gate structures 35, 36 and upper electrode 57 on the intrinsic polysilicon structure 221, 222, and 223, respectively. The upper electrode 57 has some holes or gaps therein, serving as dopant passages. The shape of the upper electrode 57, for example, can be a comb or fishbone or net shape. It would be more apparent from the top view of FIG. 5(e). Certainly, a conventional rectangular electrode with porous structure is acceptable. The size of the gaps is about 10 μm. The objective of the particular structure of the upper electrode 57 is to provide passages for dopants to reach the third polysilicon structure 223 (lower electrode). Steps for forming a photoresist 38 over the second intrinsic polysilicon structure 222, and implanting $BH_x$ to the portion exposed from the first intrinsic polysilicon structure 221 and the third intrinsic polysilicon structure 223 are subsequently performed, as shown in FIG. 5(*d*). The doping concentration is about $10^{15}$ cm$^{-2}$. The lower electrode region 223 are thus effectively doped. Due to the diffusion effect of the dopants in the lower electrode region 223, the highly-doped n$^+$-polysilicon electrode is formed. Therefore, the conductivity of the lower electrode 223 is improved.

Figure 2H:
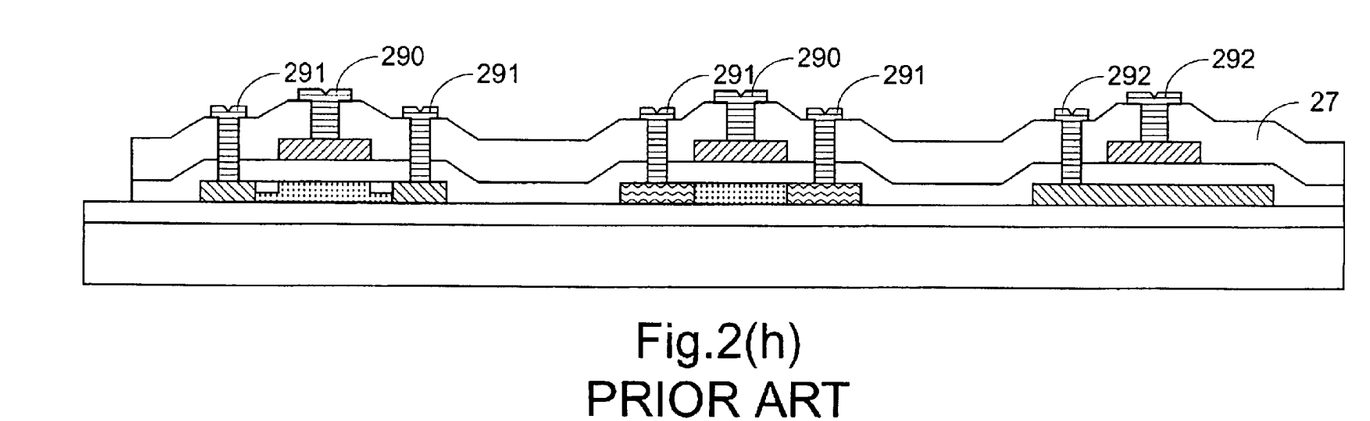

Afterwards, the p$^+$-doping procedure is performed for the p-channel TFT in a manner as illustrated with reference to FIG. 2(*f*), and steps including growing 600 nm interlayer dielectric layer (e.g. silicon dioxide layer); creating contact holes by a reactive ion etching (RIE) procedure of the interlayer dielectric layer; and sputtering 400 nm metal layer (e.g. aluminum layer) and patterning it to form electrode connection lines, as illustrated with reference to FIGS. 2(*g*) and 2(*h*). These steps are known to one skilled in the art and are not described in details herein.

Figure 6A:
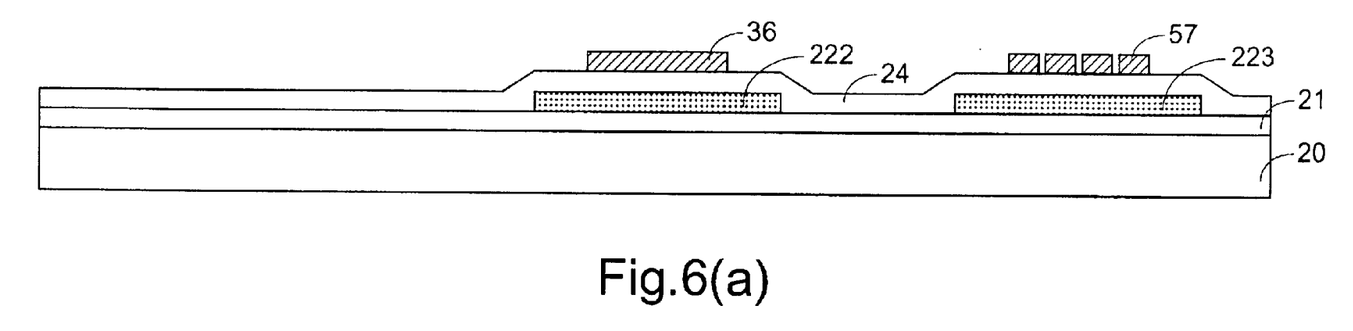
FIGS. 6(a)~(b) are schematic diagrams showing a PMOS process for manufacturing a top gate LTPS-TFT according to another preferred embodiment of the present invention.
Figure 6B:
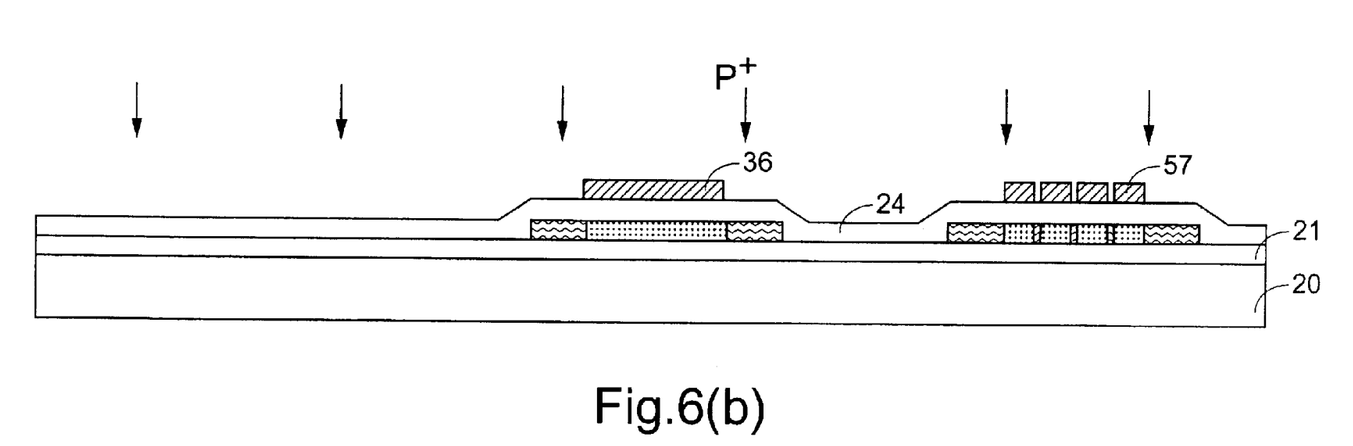

In the second embodiment, a PMOS process is illustrated with reference to FIG. 6. A buffer layer 21 and an intrinsic amorphous silicon layer are formed on the glass substrate 20. The intrinsic amorphous silicon layer is transformed into an intrinsic polysilicon layer by a laser crystallization process. After the micro-photolithography and etch steps, the second intrinsic polysilicon structure 222 and third intrinsic polysilicon structure 223 are formed, and later provided as parts of p-channel TFT and storage capacitor respectively. Then, the structure is covered with a gate insulator 24 and a gate metal layer. A micro-photolithography process is executed to pattern the gate metal layer and thus form the gate structure 36 and upper electrode 57 with dopant passages on the intrinsic polysilicon structure 222 and 223, respectively. Referring to FIG. 6(*b*), the second intrinsic polysilicon structure 222 and third intrinsic polysilicon structure 223 are p$^+$-doped. The third polysilicon structure 223 is doped through the dopant passages penetrating through the upper electrode 57. Therefore, the lower electrode region 223 is effectively doped, and its conductivity is significantly improved.

Figure 7A:
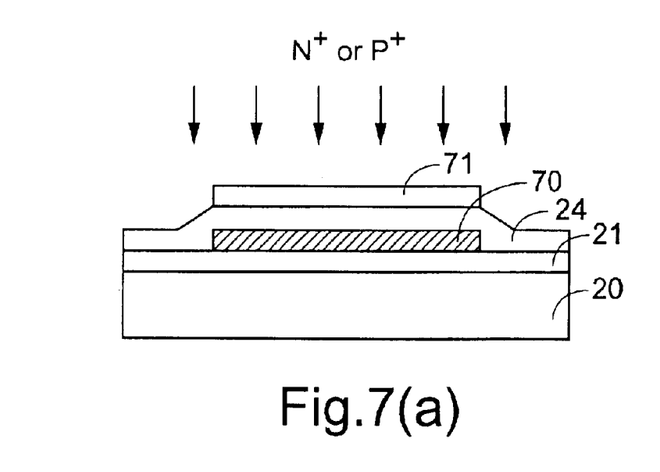
FIGS. 7(a)~(b) are schematic diagrams showing a process for manufacturing a top gate LTPS-TFT according to a further preferred embodiment of the present invention.
Figure 7B:
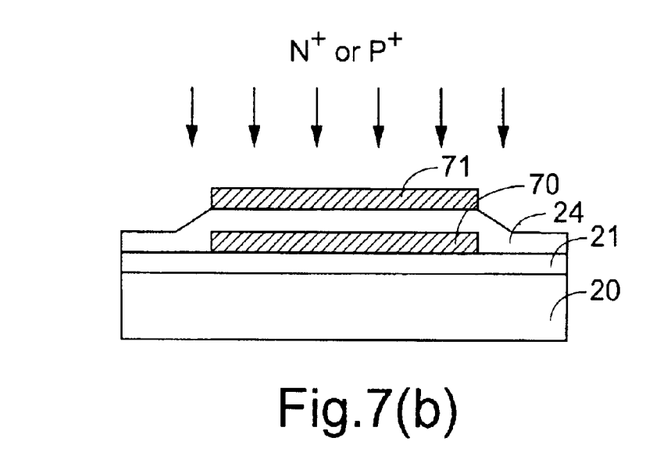

A third preferred embodiment of the present invention is illustrated with reference to FIG. 7. In this embodiment, intrinsic polysilicon are used for forming both the upper electrode 71 and the lower electrode 70. The upper electrode 71 has a continuous structure in this embodiment because the dopants can penetrate through the upper electrode 71 without the presence of the dopant passages. Please refer to FIG. 7(*a*). The first doping step is performed to provide dopants for the lower electrode 70. The implantation depth must be great enough to highly dope the lower electrode 70, for example by a doping intensity of 10 KeV, $10^{15}$ cm$^{-2}$. The second doping step, as shown in FIG. 7(*b*), is performed for providing dopants for the upper electrode 71 to make the upper electrode 71 highly doped by a doping intensity of 200 KeV, $10^{15}$ cm$^{-2}$.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A storage capacitor of a planar display, comprising:
    a substrate;
    a lower electrode formed on said substrate and made of a semiconductor material;
    an insulator layer formed on said lower electrode; and
    an upper electrode formed on said insulator layer and having a dopant passage therein for allowing dopants to penetrate therethrough to reach said lower electrode.

2. The storage capacitor according to claim 1 wherein said planar display is a top gate thin film transistor liquid crystal display (TFT-LCD) and said substrate is a transparent substrate.

3. The storage capacitor according to claim 2 wherein said top gate TFT-LCD is a low temperature polysilicon (LTPS) TFT-LCD.

4. The storage capacitor according to claim 2 wherein said lower electrode is made of doped polysilicon.

5. The storage capacitor according to claim 2 wherein said lower electrode is electrically connected to the drain electrode of a top gate TFT of said LCD.

6. The storage capacitor according to claim 1 wherein said insulator layer is made of silicon dioxide.

7. The storage capacitor according to claim 1 wherein said upper electrode is made of metal.

8. The storage capacitor according to claim 1 wherein said upper electrode is in a shape selected from a group consisting of a comb, a fishbone, and a net.

9. A process for fabricating a storage capacitor of a planar display comprising steps of:
    providing a substrate;
    applying a semiconductor layer onto said substrate;
    defining a lower electrode region in said semiconductor layer;
    applying an insulator layer onto said lower electrode region;
    forming an upper electrode having a dopant passage therein on said insulator layer; and
    doping said lower electrode region through said dopant passage to form said lower electrode.

10. The process according to claim 9 wherein said semiconductor layer is made of polysilicon.

11. The process according to claim 9 wherein said lower electrode region is defined by a micro-photolithography procedure perfomed on said semiconductor layer.

12. The process according to claim 9 wherein said upper electrode is formed with a comb, fishbone or a net shape by a micro-photolithography procedure perfomed on a metal layer.

13. The process according to claim 9 wherein said doping step is perfomed along with the source/drain formation of a TFT of the planar display.

14. A process for fabricating a storage capacitor of a planar display comprising steps of:
    providing a substrate;
    applying a first semiconductor layer onto said substrate;
    defining a lower electrode in said first semiconductor layer;
    applying an insulator layer onto said lower electrode region;
    applying a second semiconductor layer onto said insulator layer;

defining an upper electrode in said second semiconductor layer;

performing a first doping operation with a first doping intensity to provide dopants in said lower electrode; and performing a second doping operation with a second doping intensity less than said first doping intensity to provide dopants in said upper electrode.

15. The process according to claim 14 wherein said first and second semiconductor layers are made of polysilicon.

16. The process according to claim 14 wherein said first doping operation is performed before or after said second doping operation.

17. The process according to claim 16 wherein said first and said second doping operations are performed successively.

18. A storage capacitor of a planar display, comprising:
a substrate;
a lower electrode formed on said substrate and made of a first doped extrinsic semiconductor material;
an insulator layer formed on said lower electrode; and
an upper electrode formed on said insulator layer and made of a second doped extrinsic semiconductor material.

19. The storage capacitor according to claim 18 wherein said first and second doped extrinsic semiconductor materials are both polysilicon.

20. The storage capacitor according to claim 18 wherein said lower electrode is electrically connected to the drain electrode of a top gate TFT of said LCD.

* * * * *